(12) United States Patent
Dunne et al.

(10) Patent No.: US 7,956,431 B2
(45) Date of Patent: Jun. 7, 2011

(54) METHOD OF MANUFACTURING AN IMAGE SENSING MICROMODULE

(75) Inventors: Brendan Dunne, Gardanne (FR); Kevin Channon, Edinburgh (GB); Eric Christison, Edinburgh (GB); Robert Nicol, Lanarkshire (GB)

(73) Assignees: STMicroelectronics Rousset SAS, Rousset (FR); STMicroelectronics R&D Limited, Buckinghamshire (GB)

( * ) Notice: Subject to any disclaimer, the term of this patent is extended or adjusted under 35 U.S.C. 154(b) by 185 days.

(21) Appl. No.: 12/254,672

(22) Filed: Oct. 20, 2008

(65) Prior Publication Data

US 2009/0267172 A1    Oct. 29, 2009

(30) Foreign Application Priority Data

Oct. 23, 2007  (FR) ..................................... 07 07409

(51) Int. Cl.
*H01L 31/02* (2006.01)
(52) U.S. Cl. ................ 257/434; 257/680; 257/E21.499; 257/E23.18; 257/E31.11; 438/64
(58) Field of Classification Search .................. 257/434, 257/680, E21.499, E23.18, E31.11; 438/64
See application file for complete search history.

(56) References Cited

U.S. PATENT DOCUMENTS

| 2006/0035415 | A1 | 2/2006 | Wood et al. | |
| 2007/0126081 | A1* | 6/2007 | Webster et al. | 257/565 |
| 2008/0252771 | A1* | 10/2008 | Wu | 348/340 |

FOREIGN PATENT DOCUMENTS

| EP | 1 523 043 A2 | 4/2005 |
| EP | 1 662 564 A1 | 5/2006 |

\* cited by examiner

*Primary Examiner* — Trung Dang
(74) *Attorney, Agent, or Firm* — Lisa K. Jorgenson; Timothy L. Boller; Seed IP Law Group PLLC

(57) ABSTRACT

A method of manufacturing a micromodule including the steps of: producing an integrated circuit on an active face of a chip made of a semi-conductive material, making a via passing through the chip, electrically linked to the integrated circuit, and inserting the chip into a box comprising a cavity and an electrically conductive element, the active face of the chip being disposed towards the bottom of the cavity, forming on at least one part of a lateral face of the chip a conductive lateral layer made of an electrically conductive material, electrically linked to a conductive element of the rear face of the chip, and producing a connection between the conductive lateral layer and the conductive element by depositing an electrically conductive material in the cavity.

30 Claims, 6 Drawing Sheets

METHOD OF MANUFACTURING AN IMAGE SENSING MICROMODULE

BACKGROUND

1. Technical Field

The present disclosure relates to integrated circuits, and in particular to CMOS imagers.

2. Description of the Related Art

Imagers produced according to the CMOS ("Complementary Metal Oxide Semiconductor") technology are currently the subject of an increasing number of applications due to their low cost price in comparison with CCD (Charge Coupled Device) imagers. Such CMOS imagers were initially used to produce low resolution image sensors of mediocre quality (for example web cameras). Today, after major investment in research and development, CMOS imagers can compete with CCD imagers. The present disclosure is in line with an effort to improve this imager technology aiming to reduce cost prices with the same quality.

BRIEF SUMMARY

FIG. 1, discussed in more detail below, represents an example of a CMOS imager integrated into an image and/or video sensing micromodule. The assembly, comprising a frame 2, an optical set 3 with lenses, a transparent plate 6 and an imager 11, forms an image sensing micromodule capable of being soldered and connected to the printed circuit wafer 7.

An embodiment provides for connecting an ESD/EMC protective element for protecting the frame 2 and/or the integrated circuit by passing through one or more connection bumps of the integrated circuit and through opposite connection pads, provided on the printed circuit wafer 7. Therefore, it is not necessary to provide specific conductive paths on the printed circuit wafer to connect the printed circuit wafer to the ESD/EMC protective element of the frame.

An embodiment provides a method of manufacturing a micromodule comprising steps of producing an integrated circuit on an active face of a chip made of a semi-conductive material, making a via passing through the chip, electrically linking the integrated circuit to a conductive element on a rear face of the chip, and inserting the chip into a box comprising a cavity and an electrically conductive element, the active face of the chip being disposed towards the bottom of the cavity.

According to one embodiment, the method comprises steps of forming, on at least one part of a lateral face of the chip, a conductive lateral layer made of an electrically conductive material, electrically linked to a conductive element of a rear face of the chip, and producing a connection between the conductive lateral layer and the conductive element, by depositing an electrically conductive material in the cavity.

According to one embodiment, the conductive lateral layer is electrically linked to the via.

According to one embodiment, the conductive lateral layer is formed on all the lateral faces of the chip.

According to one embodiment, the method comprises a step of forming an electrically insulating layer in contact with the semi-conductive material of the chip on the rear face and the lateral face of the chip, and on the lateral walls and the bottom of the via.

According to one embodiment, the via is made by forming an orifice passing through the semi-conductive material of the chip and by depositing an electrically conductive layer on the lateral walls and the bottom of the orifice.

According to one embodiment, the through orifice and the lateral faces of the chip are formed by etching the semi-conductive material.

According to one embodiment, the method comprises steps of fixing the active face of the chip onto a support plate and of thinning the chip.

According to one embodiment, the integrated circuit is an image sensor, the support plate being formed in a transparent material.

According to one embodiment, the electrically conductive element forms an ESD/EMC protection for the integrated circuit.

According to one embodiment, integrated circuits are collectively manufactured on a wafer made of a semi-conductive material that is cut to obtain individual chips each comprising one integrated circuit.

According to one embodiment, the method comprises steps of forming on the rear face of the chip connection bumps connected at least partly to the active face of the integrated circuit through vias passing through the semi-conductive material.

According to one embodiment, the conductive lateral layer is electrically linked to a connection bump.

According to one embodiment, the height of the top of the connection bumps above the conductive material is greater than 50 μm.

According to one embodiment, the conductive material comprises a glue fixing the chip in the cavity.

One embodiment relates to a micromodule comprising: an integrated circuit formed on an active face of a chip made of a semi-conductive material, comprising a via passing through the chip, electrically linked to the integrated circuit, and a box comprising an electrically conductive element and a cavity into which the chip is inserted, the active face being disposed towards the bottom of the cavity.

According to one embodiment, the micromodule comprises a conductive lateral layer made of an electrically conductive material formed on at least one part of a lateral face of the chip and electrically linked to a conductive element of a rear face of the chip, and a connection between the conductive lateral layer and the conductive element, produced by means of an electrically conductive material deposited in the cavity.

According to one embodiment, the conductive lateral layer is electrically linked to the via.

According to one embodiment, the conductive lateral layer is formed on all the lateral faces of the chip.

According to one embodiment, the micromodule comprises an electrically insulating layer in contact with the semi-conductive material of the chip on the rear face and the lateral face of the chip, and on the lateral walls and the bottom of the via.

According to one embodiment, the via is formed in an orifice passing through the semi-conductive material of the chip by depositing an electrically conductive layer on the lateral walls and the bottom of the orifice.

According to one embodiment, the active face of the chip is fixed onto a support plate and the chip has undergone a thinning treatment.

According to one embodiment, the integrated circuit is an image sensor, the support plate being formed in a transparent material.

According to one embodiment, the electrically conductive element forms an ESD/EMC protection for the integrated circuit.

According to one embodiment, the rear face of the chip comprises connection bumps connected at least partly to the active face of the integrated circuit through vias passing through the semi-conductive material.

According to one embodiment, the conductive lateral layer is electrically linked to a connection bump.

According to one embodiment, the height of the top of the connection bumps above the conductive material is greater than 50 µm.

According to one embodiment, the conductive material comprises a glue fixing the chip in the cavity.

In one embodiment, a method of manufacturing a micromodule, comprising steps of: producing an integrated circuit on an active face of a chip made of a semi-conductive material; making a via passing through the chip, electrically linking the integrated circuit to a conductive element on a rear face of the chip; forming, on at least one part of a lateral face of the chip, a conductive lateral layer made of an electrically conductive material, electrically linked to a conductive element of the rear face of the chip; inserting the chip into a box comprising a cavity and an electrically conductive element, the active face of the chip being disposed towards the bottom of the cavity; and producing a connection between the conductive lateral layer and the conductive element, by depositing an electrically conductive material in the cavity. In one embodiment, the conductive lateral layer is electrically linked to the via. In one embodiment, the conductive lateral layer is formed on all the lateral faces of the chip. In one embodiment, the method comprises a step of forming an electrically insulating layer in contact with the semi-conductive material of the chip on the rear face and the lateral face of the chip, and on the lateral walls and the bottom of the via. In one embodiment, the via is made by forming an orifice passing through the semi-conductive material of the chip and by depositing an electrically conductive layer on the lateral walls and the bottom of the orifice. In one embodiment, the through orifice and the lateral faces of the chip are formed by etching the semi-conductive material. In one embodiment, the method comprises steps of fixing the active face of the chip onto a support plate and of thinning the chip. In one embodiment, wherein the integrated circuit is an image sensor, the support plate being formed in a transparent material. In one embodiment, the electrically conductive element is configured to provide ESD/EMC protection for the integrated circuit. In one embodiment, integrated circuits are collectively manufactured on a wafer made of a semi-conductive material that is cut to obtain individual chips each comprising one integrated circuit. In one embodiment, the method comprises steps of forming on the rear face of the chip connection bumps connected at least partly to the active face of the integrated circuit through vias passing through the semi-conductive material. In one embodiment, the conductive lateral layer is electrically linked to a connection bump. In one embodiment, a height of the connection bumps above the conductive material is greater than 50 µm. In one embodiment, the conductive material comprises a glue fixing the chip in the cavity.

In one embodiment, a micromodule comprises: a chip comprising a semi-conductive material and having: an integrated circuit formed on an active face of the chip; a via passing through the chip and electrically linked to the integrated circuit; and a conductive lateral layer made of an electrically conductive material formed on at least one part of a lateral face of the chip and electrically linked to a conductive element of a rear face of the chip; a box comprising an electrically conductive element and a cavity into which the chip is inserted, the active face being disposed towards the bottom of the cavity; and an electrically conductive material deposited in the cavity and configured to electrically couple the conductive lateral layer and the conductive element. In one embodiment, the conductive lateral layer is electrically linked to the via. In one embodiment, the conductive lateral layer is formed on all the lateral faces of the chip. In one embodiment, the micromodule comprises an electrically insulating layer in contact with the semi-conductive material of the chip on the rear face and the lateral face of the chip, and on the lateral walls and the bottom of the via. In one embodiment, the via comprises an electrically conductive layer deposited on lateral walls and a bottom of an orifice passing through the semi-conductive material of the chip. In one embodiment, the active face of the chip is fixed onto a support plate and the chip has undergone a thinning treatment. In one embodiment, the support plate comprises a transparent material. In one embodiment, the electrically conductive element is configured to provide ESD/EMC protection for the integrated circuit. In one embodiment, the rear face of the chip comprises connection bumps connected at least partly to the active face of the integrated circuit through vias passing through the semi-conductive material. In one embodiment, the conductive lateral layer is electrically linked to a connection bump. In one embodiment, a height of the connection bumps above the conductive material is greater than 50 µm. In one embodiment, the conductive material comprises a glue fixing the chip in the cavity.

In one embodiment, a system comprises: a chip comprising a semi-conductive material and having: an integrated circuit formed on an active face of the chip; a via passing through the chip and electrically linked to the integrated circuit; and means for electrically coupling a lateral face of the chip to a rear face of the chip; and means for receiving the chip, including: means for providing electrostatic discharge protection; and means for electrically coupling the means for providing electrostatic discharge to the means for electrically coupling the lateral face of the chip to the rear face of the chip. In one embodiment, the means for electrically coupling the lateral face of the chip to the rear of the chip comprises a conductive lateral layer made of an electrically conductive material formed on at least one part of a lateral face of the chip and electrically linked to a conductive element of a rear face of the chip. In one embodiment, the means for receiving the chip comprises a box having: an electrically conductive element; a cavity into which the chip is inserted, the active face being disposed towards the bottom of the cavity; and an electrically conductive material deposited in the cavity and configured to electrically couple the means for electrically coupling the lateral face of the chip and to the rear face of the chip and the conductive element. In one embodiment, the chip comprises a connection bump on the active face of the chip electrically coupled to the rear of the chip through the via and the electrically conductive material electrically couples the connection bump to the electrically conductive element. In one embodiment, the integrated circuit is configured to sense images.

BRIEF DESCRIPTION OF THE SEVERAL VIEWS OF THE DRAWINGS

Examples of embodiments will be described below in relation with, but not limited to, the following figures, in which.

DETAILED DESCRIPTION

Figure 1:
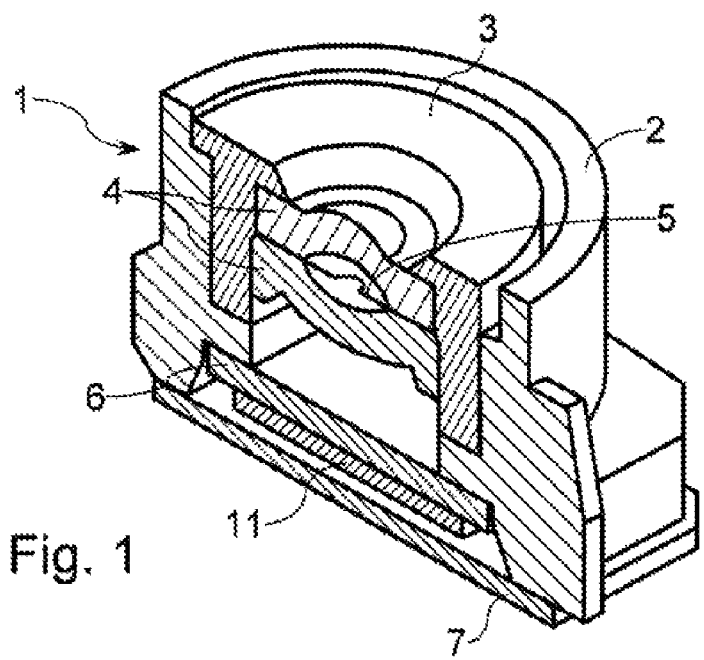
FIG. 1 represents an image and/or video sensing micromodule.

FIG. 1 represents an example of a CMOS imager integrated into an image and/or video sensing micromodule, intended, for example, to be mounted into a portable device such as a mobile telephone, a camera or a video camera. The module 1 comprises a frame 2, an optical set or lens-holder block 3, a lens-based objective 4 mounted in the block 3 with a diaphragm 5, and a transparent shield plate 6 in which an infrared filter is produced for example. The imager 11 is fixed with the transparent plate 6 in a cavity of the frame comprising an opening, so as to receive the light passing through the lenses 4, the diaphragm 5 and the transparent plate 6. The rear face of the chip generally comprises connection bumps (or solder balls) arranged for being reflow soldered onto conductive pads provided on a printed circuit wafer 7. The connection bumps are electrically linked to conductive paths for routing the active face of the chip through conductive bushings or through silicon vias TSV. A CMOS imager generally comprises in the order of 20 to 30 connection bumps.

Thus, the assembly, comprising the frame 2, the optical set 3 with the lenses, the transparent plate 6 and the imager 11, forms an image sensing micromodule capable of being soldered and connected to the printed circuit wafer 7.

Now, CMOS-type integrated circuits, and in particular the CMOS imagers, should have protection against Electrostatic Discharge ESD and Electromagnetic Interferences EMI, and provide for Electromagnetic compatibility EMC. Such protection may comprise a connection of a protective circuit provided on the integrated circuit to an electrically conductive protective element such as a metal coating, provided on the frame 2. This connection may be done through the printed circuit wafer 7 that comprises a connection element such as a conductive path, designed to come into contact with the protective element provided on the frame 2. The rear face of the chip 11 can then comprise connection bumps dedicated to the ESD/EMC protection.

Now, the connection of a conductive path on the wafer 7 to a metal coating on the frame 2 proves to be difficult to do.

Figure 2:
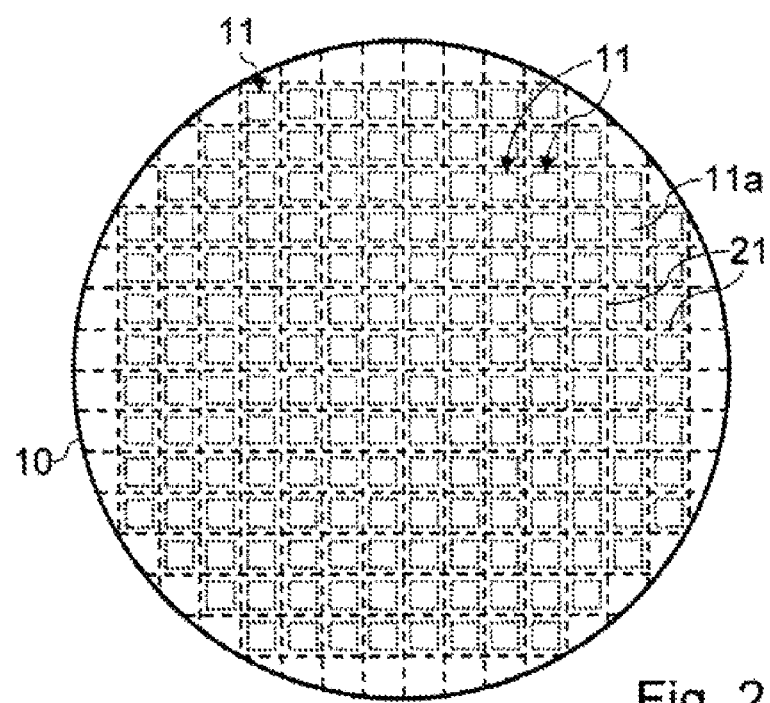
FIG. 2 is a top view of a silicon wafer on which integrated circuits are collectively produced.
Figure 3:
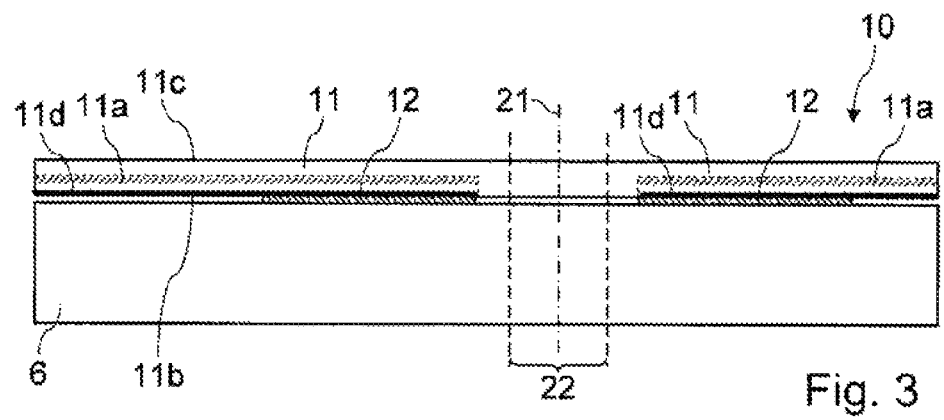
FIGS. 3 through 5 are cross-sections of a portion of a silicon wafer comprising a plurality of integrated circuits, at different steps in the manufacturing method according to one embodiment.

FIGS. 2 to 10 show one embodiment of a method of manufacturing a micromodule. FIG. 2 represents a silicon wafer 10 seen from the top and FIG. 3 represents a portion of the wafer 10 seen in cross section. The wafer 10 receives a plurality of integrated circuit regions 11a collectively implanted into the silicon in a classical manner on an active face 11b. The integrated circuit regions are delimited by scribe lines 21, arranged horizontally and vertically in the figure. The wafer 10 will later be cut along the scribe lines 21 to separate the integrated circuit regions and to obtain individual integrated circuits in the form of chips 11.

In the example in FIG. 3, the active face 11b of the wafer 10 has been fixed onto a shield support plate 6. If the integrated circuits of the wafer 10 are CMOS imagers, the support plate 6 is transparent. The plate 6 and the wafer 10 are assembled, for example, by means of a layer of glue 12 spread in zones of the active face of the wafer 10 outside the optically sensitive zones of the integrated circuits 11a, and possibly outside scribe paths 22 centered on the scribe lines 21. If the layer of glue 12 is transparent, it can cover the entire surface of the wafer 10.

In this example, the wafer 10 has undergone a thinning step, by chemical and/or mechanical backlap for example. The thickness of the wafer, initially in the order of 700 μm, can thus be reduced to a value below 100 μm, and advantageously in the order of 70 μm. As the wafer 10 is fixed onto the support plate 6 that, for example, has a thickness in the order of 500 μm, it can be handled without the risk of being broken.

Figure 4:
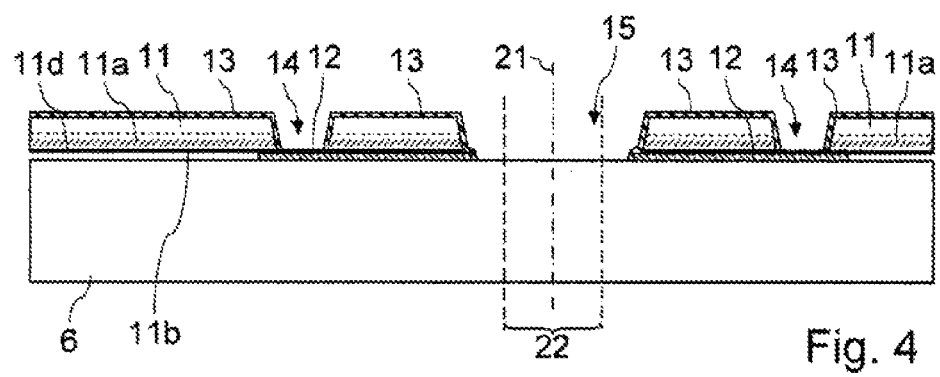

FIG. 4 represents the wafer 10 associated with the plate 6, after having undergone steps of etching and passivating the silicon. The etching step aims to form orifices 14 passing through the wafer 10 and to remove the silicon from the scribe paths 22 so as to form grooves 15 with the support plate 6. The silicon can be etched classically by subjecting the rear face 11c to a plasma through a mask. The etching is performed until the metallization layers 11d formed on the active face 11b are reached.

The orifices 14 enable through silicon vias TSV to be produced, i.e., conductive bushings providing an electric connection between two conductive layers, here between two conductive paths provided on the active face and on the rear face of the wafer.

It shall be noted that the walls of the orifices 14 and the lateral faces of the grooves 15 may be straight or slightly inclined as can be seen on the figures.

The step of passivating the silicon comprises depositing an electrically insulating layer 13 over the entire exposed surface of the silicon, including the lateral faces of the grooves 15 and the walls of the orifices 14. The insulating layer is then etched to remove the insulating layer from the scribe paths 22 and the bottoms of the orifices 14. The layer 13 may comprise silicon oxide $SiO_2$ or any other known oxide or insulator, for example silicon oxynitride SiON.

Figure 5:
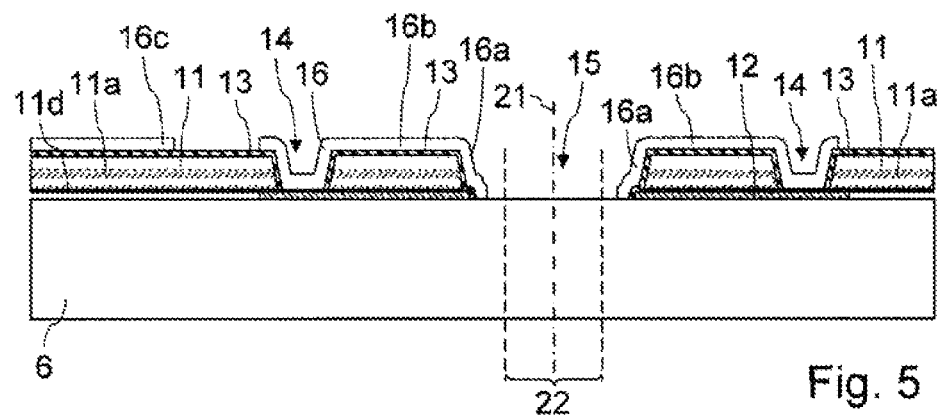
Figure 6:
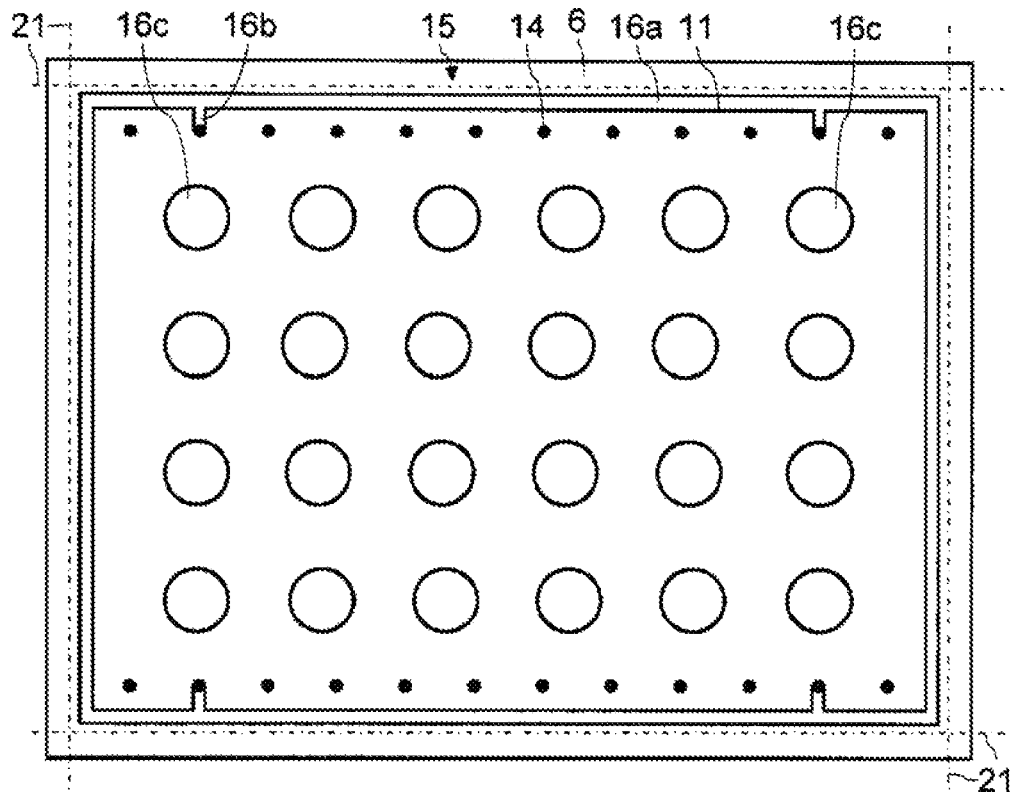
FIG. 6 is a view of the rear face of a part of the wafer represented in FIG. 5, FIGS. 7 and 8 are cross-sections of a part of the wafer, at other steps in the manufacturing method.

FIGS. 5 and 6 represent the silicon wafer 10 after undergoing a step of forming an electrically conductive layer 16 on the insulating layer 13.

The layer 16 can be produced by depositing the layer made of an electrically conductive material over the entire surface of the wafer 10. The layer 16 is then etched to free the scribe paths 22 and to form conductive paths 16b and pads 16c on the rear face 11c of the chips 11. In FIGS. 5 and 6, the layer 16 covers the walls and the bottom of the orifices 14 so as to form the vias electrically linked to a metallization layer 11d of the integrated circuit 11a. The layer 16 also comprises a lateral part 16a at least partly covering the lateral faces of each chip 11, along the scribe paths 22. The layer 16 also comprises contact pads 16c, conductive paths linking the vias 14 to the contact pads (not represented) and conductive paths 16b linking certain vias to the lateral part 16a. The layer 16 is, for example, made of copper or aluminum.

In the example in FIG. 6, the lateral part 16a of the conductive layer 16 entirely covers the lateral faces of the chip 11 and is electrically linked to four vias through conductive paths 16b.

The orifices 14 may have a diameter in the order of 65 μm, while the layer 16 may have a thickness in the order of 5 μm.

For the sake of clarity, only the conductive paths 16b linking the lateral part 16a to vias 14 have been represented. The vias are connected to contact pads 16c. Some of the conductive pads 16c may not be connected to a via.

Figure 7:
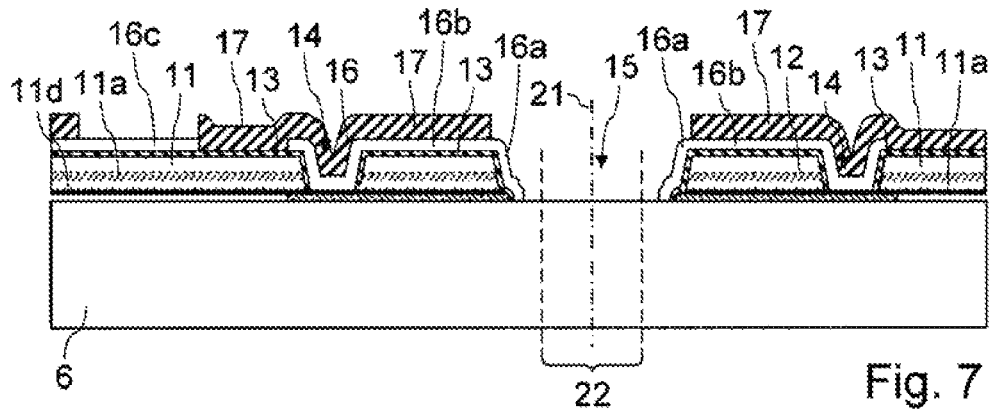

FIG. 7 represents a portion of the silicon wafer 10 after undergoing a step of forming an electrically insulating layer 17 on the layer 16.

The insulating layer 17 may also be formed by depositing and etching an electrically insulating material, so as to cover the entire wafer 10, except for the scribe paths 22, the lateral part 16a and the contact pads 16c. The insulating layer is for example made of a hardened vitreous paste or a polyimide.

Figure 8:
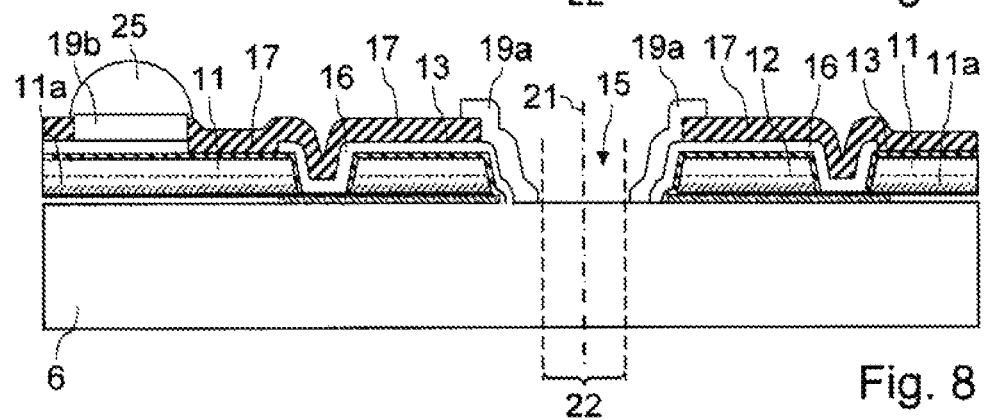
Figure 9:
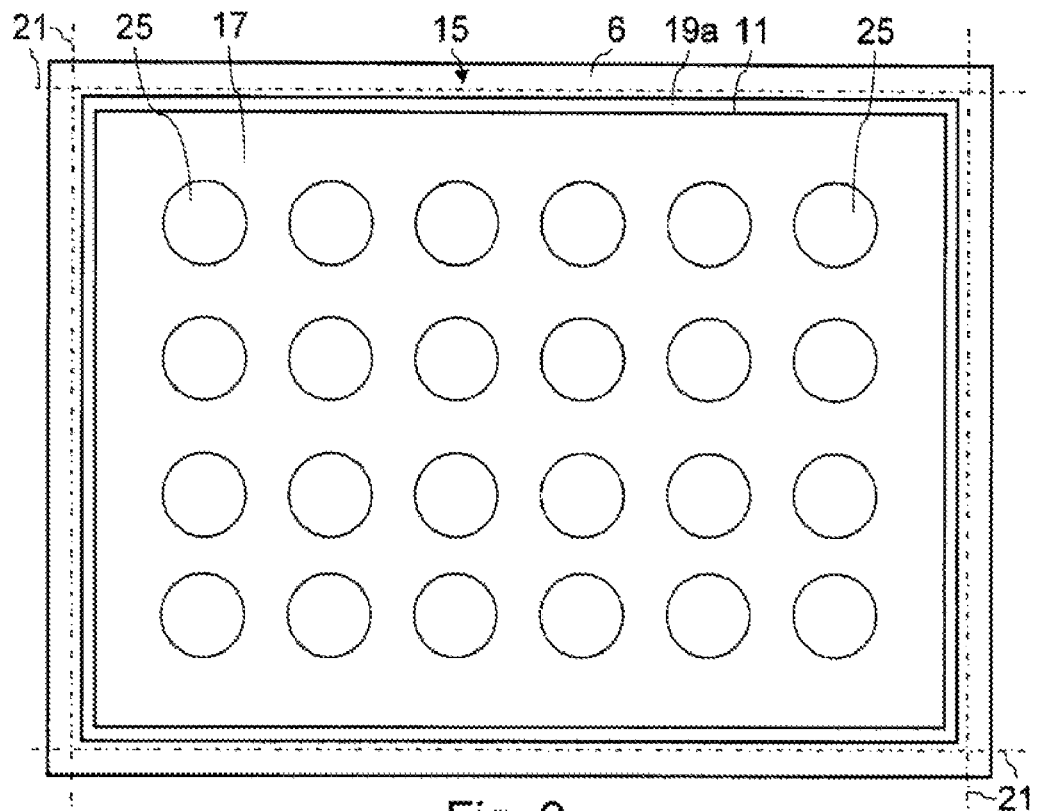
FIG. 9 is a view of the rear face of a part of the wafer represented in FIG. 8.

FIGS. 8 and 9 represent a portion of the silicon wafer 10 after undergoing steps of forming a conductive layer 19a, 19b on the parts 16a, 16c of the conductive layer 16 not covered by the insulating layer 17, and of forming connection bumps 25 on the contact pads 16c previously covered by the conductive layer 19a, 19b.

The conductive layer 19a, 19b comprises a part 19a covering the lateral part 16a formed on the lateral faces of the chips 11, and parts 19b covering the contact pads 16c. The layer 19a, 19b is provided to prevent the oxidation of the conductive layer 16 when the latter is made of copper. The layer 19a, 19b may be produced by depositing and etching an electrically conductive material, such as an alloy containing gold, titanium and nickel.

The connection bumps 25 that are produced on the conductive layer 19b enable each chip 11 to be connected to and fixed onto a printed circuit wafer. The printed circuit wafer is for example the wafer 7 represented in FIG. 1. The bumps 25 may, for example, be made of gold or copper, or even of a composition of metals or a eutectic or non-eutectic alloy.

In a next step, the support plate 6 is cut to individualize the chips 11.

Figure 10:
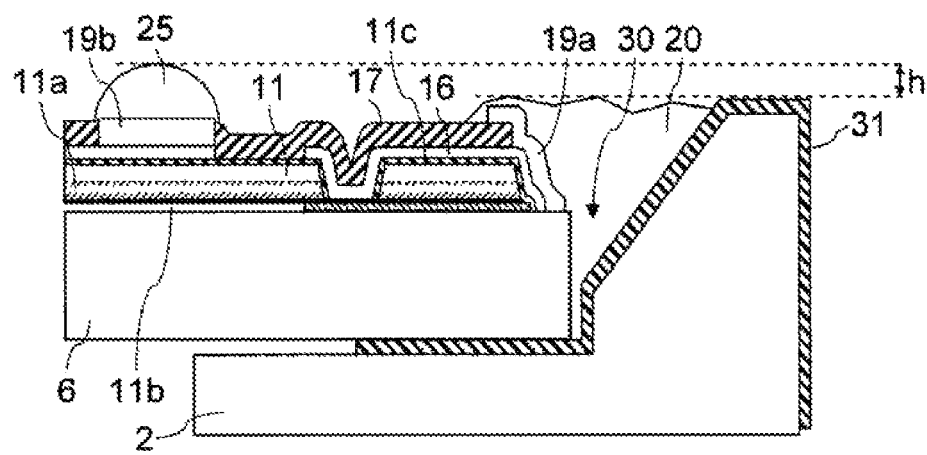
FIG. 10 is a cross-sectional view of a part of a micromodule at a final step in an embodiment of a manufacturing method.

FIG. 10 shows steps of a method during which individualized chips 11 associated with a part of the support plate 6, may be introduced into a cavity 30 of a box, and connected to an external ESD/EMC protective circuit. In the example in FIG. 1, the box comprises the frame 2.

In FIG. 10, an electrically conductive layer 31 protecting against electrostatic discharge and electromagnetic fields covers at least partially the inside of the cavity 30, and/or the external environment of the box 2. The chip 11 is introduced into the cavity 30, the support plate 6 being put into the cavity first so as to rest on the bottom of the cavity. The rear face 11c of the chip 11 is then substantially in the plane of the opening of the cavity.

In a next step, the conductive layer 19a formed on the lateral edges of the chip 11 is electrically linked to the electrically conductive layer 31 of the box. This step is performed by forming a conductive bridge 20 between the two elements to be linked. The conductive bridge 20 is, for example, formed by depositing an electrically conductive material 20 in the gap between the lateral walls of the cavity and the electrically conductive lateral edges 19a of the chip 11. The conductive material can be, for example, any classically conductive material used in microelectronics, for example a paste or an electrically conductive glue. The use of an electrically conductive glue facilitates the chip 11 to be simultaneously fixed into the cavity 30.

The edges of the cavity may be flared as represented in FIG. 10, particularly so as to facilitate the introduction of the conductive material 20.

It shall be noted that, if the integrated circuit 11a is connected by connection bumps, the conductive material 20 should not prevent the connection. For this purpose, the height h of the top of the bumps 25 above the surface of the conductive material may be greater than, for example, 50 µm.

It shall also be noted that for more effective ESD/EMC protection, it is preferable that the connection resistance be as low as possible. For this purpose, the lateral part 16a of the layer 16 covered by the layer 19a, may cover the lateral faces of the chips entirely, so as to form a ring. In addition, the conductive material 20 may be deposited so as to cover the layer 19a entirely.

In an alternate embodiment, the lateral part 16a, 19a may form several lateral connection pads, enabling the integrated circuit to be connected to several external conductors, each of the connection pads may be linked to the integrated circuit 11a through a via 14 specific to it.

Figure 11:
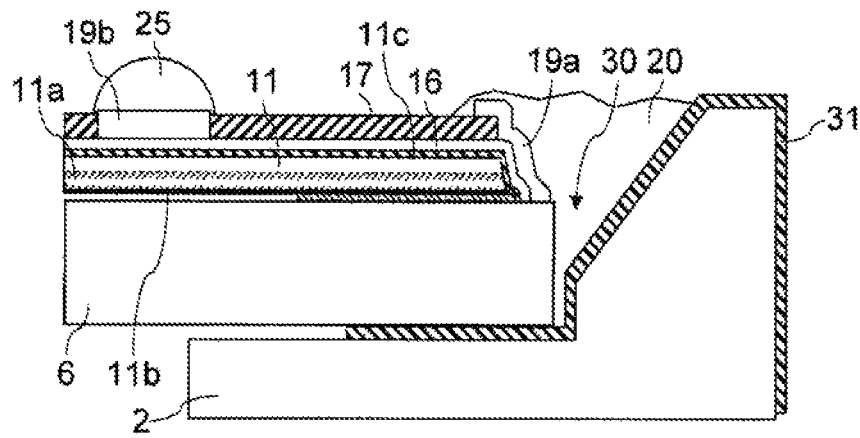
FIG. 11 is a cross-sectional view of a part of a micromodule at a final step of another embodiment.
Figure 12:
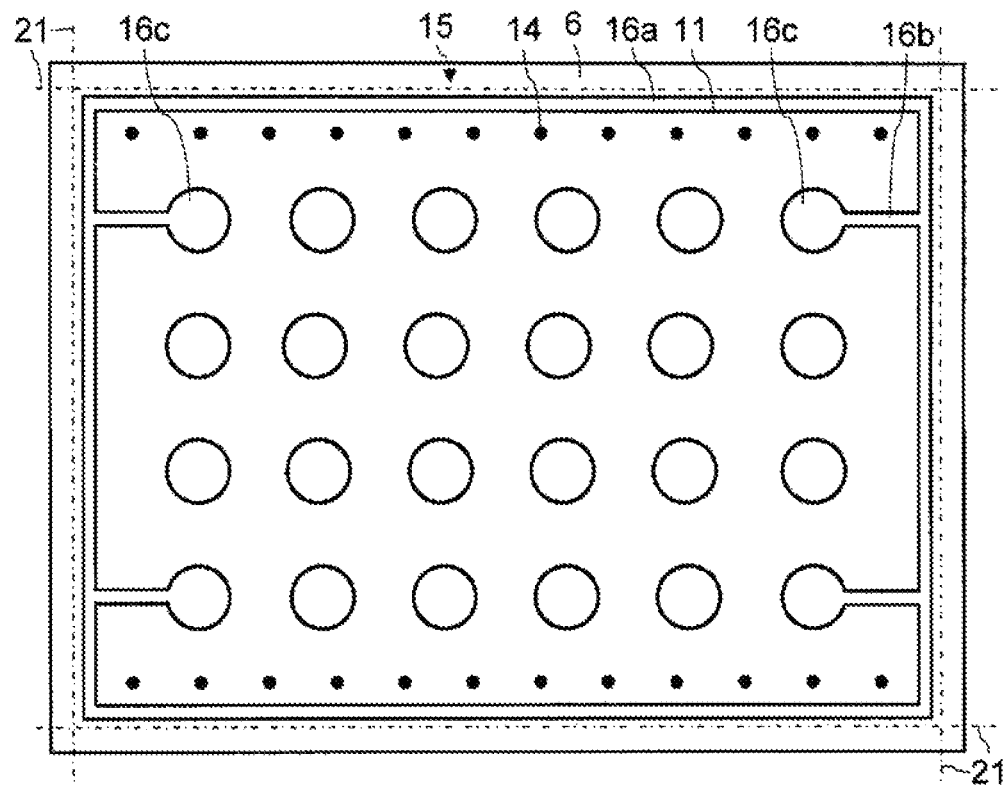
FIG. 12 is a view of the rear face of a part of the wafer in FIG. 11 at an intermediate manufacturing step.

FIGS. 11 and 12 represent an alternative of the micromodule represented in FIG. 10. In FIGS. 11 and 12, the micromodule differs from the one described previously in that the conductive paths 16b link the lateral part(s) 16a directly to conductive pads 16c without passing through a via 14. Thus, one or more connection bumps 25 (four in the example in FIG. 12) are linked to the lateral part 16a and thus to the lateral parts 19a of the conductive layer 19a, 19b. The printed circuit wafer 7 can, therefore, be put in contact with the electrically conductive layer 31 of the box, through the rear face of the chip 11.

Figure 13:
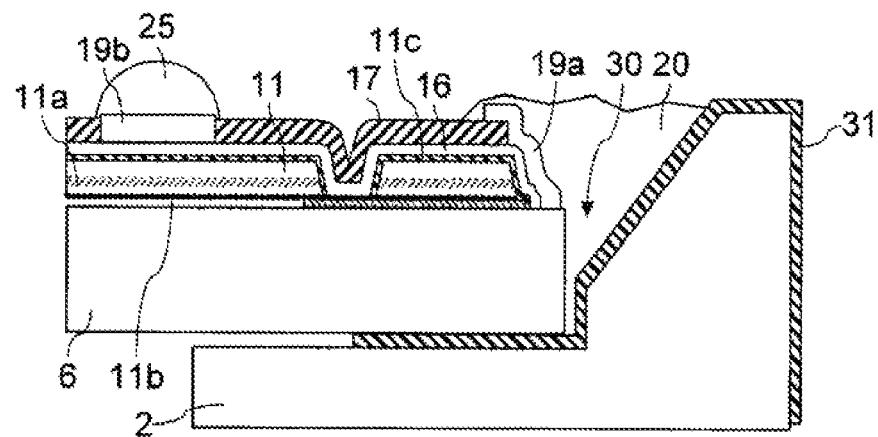
FIG. 13 is a cross-sectional view of a part of a micromodule at a final step of another embodiment.
Figure 14:
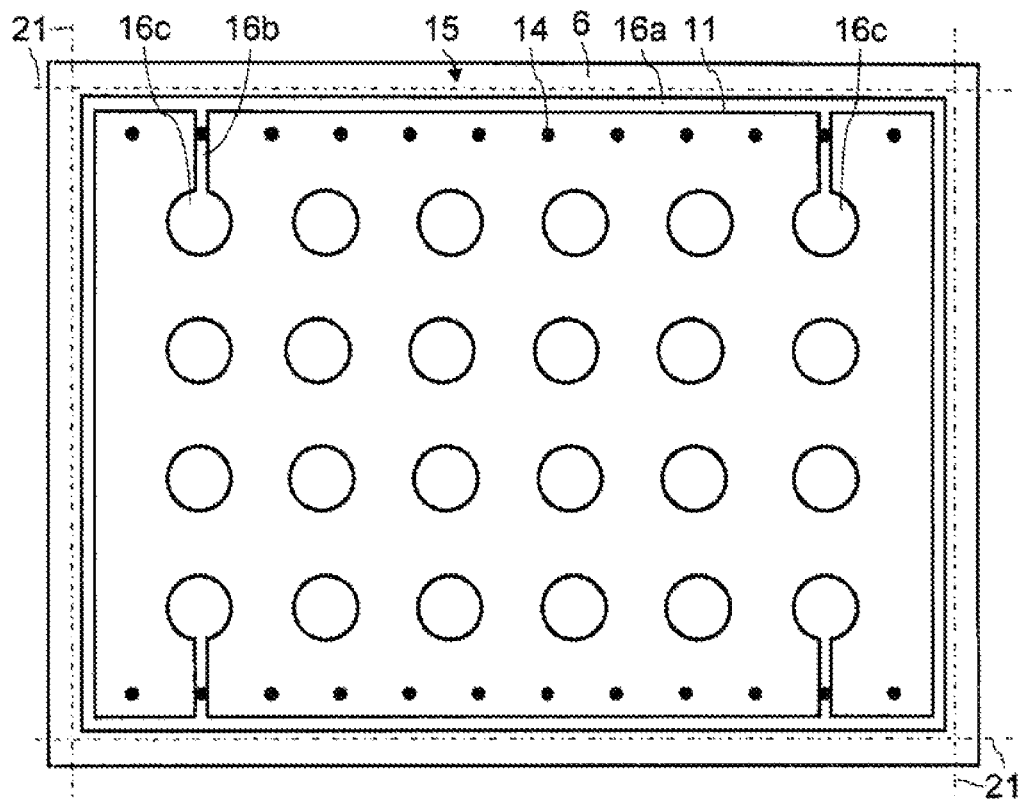
FIG. 14 is a view of the rear face of a part of the wafer in FIG. 13 at an intermediate manufacturing step.

FIGS. 13 and 14 represent another alternative of the micromodule represented in FIG. 10. In FIGS. 13 and 14, the micromodule differs from the one represented in FIG. 10 in that the conductive paths 16b link the lateral part(s) 16a both to vias 14 and to conductive pads 16c. Thus, one or more connection bumps 25 (four in the example in FIG. 14) are linked to the lateral part 16a and, thus, to the lateral parts 19a of the conductive layer 19a, 19b and to vias 14. The electrically conductive layer 31 of the box can therefore be put in contact, through the rear face of the chip 11, with both the printed circuit wafer 7 and an integrated circuit region on the active face 11b of the chip.

It will be understood by those skilled in the art that various alternative embodiments and applications of the present disclosure may be made. In particular, the present disclosure does not only apply to the connection of an ESD/EMC protective circuit of an integrated circuit to an external circuit. It applies more generally to the connection of an integrated circuit to an external circuit outside a printed circuit to which the integrated circuit is connected and fixed.

The present disclosure does not solely apply either to CMOS imagers, but to any integrated circuit requiring a connection to an external circuit by the rear face of the integrated circuit, without using the classic connections of the integrated circuit to a printed circuit wafer.

Furthermore, it is not necessary for the conductive layer 31 to be formed in the cavity in which the chip 11 is inserted. Indeed, the conductive bridge may, alternatively, be produced between the lateral face of the chip and an upper face (parallel to the rear face of the chip) of the box.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of manufacturing a micromodule, comprising steps of:
   producing an integrated circuit on an active face of a chip made of a semi-conductive material;
   making a via passing through the chip, electrically coupled to the integrated circuit;
   forming, on at least one part of a lateral face of the chip, a conductive lateral layer made of an electrically conductive material, electrically coupled to a conductive element of a rear face of the chip;

inserting the chip into a box comprising a cavity and an electrically conductive element, the active face of the chip being disposed towards a bottom of the cavity; and
producing a connection between the conductive lateral layer and the conductive element of the box, by positioning an electrically conductive material in the cavity.

2. The method according to claim 1 wherein the conductive lateral layer is electrically coupled to the via.

3. The method according to claim 1 wherein the conductive lateral layer is formed on all the lateral faces of the chip.

4. The method according to claim 1, comprising a step of forming an electrically insulating layer in contact with the semi-conductive material of the chip on the rear face and the lateral face of the chip, and on the lateral walls and the bottom of the via.

5. The method according to claim 1 wherein the via is made by forming an orifice passing through the semi-conductive material of the chip and by positioning an electrically conductive layer on the lateral walls and the bottom of the orifice.

6. The method according to claim 5 wherein the through orifice and the lateral faces of the chip are formed by etching the semi-conductive material.

7. The method according to claim 1, comprising steps of fixing the active face of the chip onto a support plate and of thinning the chip.

8. The method according to claim 7 wherein the integrated circuit is an image sensor, the support plate being formed in a transparent material.

9. The method according to claim 1 wherein the electrically conductive element is configured to provide ESD/EMC protection for the integrated circuit.

10. The method according to claim 1 wherein integrated circuits are collectively manufactured on a wafer made of a semi-conductive material that is cut to obtain individual chips each comprising one integrated circuit.

11. The method according to claim 1, comprising steps of forming on the rear face of the chip connection bumps coupled at least partly to the active face of the integrated circuit through vias passing through the semi-conductive material.

12. The method according to claim 11 wherein the conductive lateral layer is electrically coupled to a connection bump.

13. The method according to claim 12 wherein a height of the connection bumps above the conductive material is greater than 50 µm.

14. The method according to claim 1 wherein the conductive material comprises a glue fixing the chip in the cavity.

15. A micromodule, comprising:
a chip comprising a semi-conductive material and having:
an integrated circuit formed on an active face of the chip;
a via passing through the chip and electrically coupled to the integrated circuit; and
a conductive lateral layer made of an electrically conductive material formed on at least one part of a lateral face of the chip and electrically coupled to a conductive element of a rear face of the chip;
a box comprising an electrically conductive element and a cavity into which the chip is inserted, the active face being disposed towards a bottom of the cavity; and
an electrically conductive material positioned in the cavity and configured to electrically couple the conductive lateral layer and the conductive element of the box.

16. The micromodule according to claim 15 wherein the conductive lateral layer is electrically coupled to the via.

17. The micromodule according to claim 15 wherein the conductive lateral layer is formed on all the lateral faces of the chip.

18. The micromodule according to claim 15, comprising an electrically insulating layer in contact with the semi-conductive material of the chip on the rear face and the lateral face of the chip, and on the lateral walls and the bottom of the via.

19. The micromodule according to claim 15 wherein the via comprises an electrically conductive layer formed on lateral walls and a bottom of an orifice passing through the semi-conductive material of the chip.

20. The micromodule according to claim 15 wherein the active face of the chip is fixed onto a support plate and the chip has undergone a thinning treatment.

21. The micromodule according to claim 20 wherein the support plate comprises a transparent material.

22. The micromodule according to claim 15 wherein the electrically conductive element is configured to provide ESD/EMC protection for the integrated circuit.

23. The micromodule according to claim 15 wherein the rear face of the chip comprises connection bumps coupled at least partly to the active face of the integrated circuit through vias passing through the semi-conductive material.

24. The micromodule according to claim 23 wherein the conductive lateral layer is electrically coupled to a connection bump.

25. The micromodule according to claim 23 wherein a height of the connection bumps above the conductive material is greater than 50 µm.

26. The micromodule according to claim 15 wherein the conductive material comprises a glue fixing the chip in the cavity.

27. A system, comprising:
a micromodule, including:
a chip comprising a semi-conductive material and having:
an integrated circuit formed on an active face of the chip;
a via passing through the chip and electrically coupled to the integrated circuit; and
a conductive lateral layer made of an electrically conductive material formed on at least one part of a lateral face of the chip and electrically coupled to a conductive element of a rear face of the chip;
a box comprising an electrically conductive element and a cavity into which the chip is inserted, the active face being disposed towards a bottom of the cavity; and
an electrically conductive material positioned in the cavity and configured to electrically couple the conductive lateral layer and the conductive element of the box; and
a circuit external to the micromodule and electrically coupled to the micromodule.

28. The system according to claim 27 wherein the conductive lateral layer is electrically coupled to the via.

29. The system according to claim 27 wherein the conductive lateral layer is formed on all the lateral faces of the chip.

30. The system according to claim 27 wherein circuit external to the micromodule is configured to provide ESD/EMC protection to the integrated circuit of the micromodule.

* * * * *